United States Patent [19]

Bickley et al.

[11] Patent Number: 4,510,472

[45] Date of Patent: Apr. 9, 1985

[54] HIGH POWER RF RELAY SWITCH TRIGGER

[75] Inventors: Robert H. Bickley; Charles A. Bucher, both of Scottsdale; David M. Yee, Phoenix, all of Ariz.

[73] Assignee: Motorola, Inc., Schaumburg, Ill.

[21] Appl. No.: 510,716

[22] Filed: Jul. 5, 1983

[51] Int. Cl.³ .............................. H01P 1/10; H01P 1/15
[52] U.S. Cl. .................................. 333/262; 333/17 R; 307/317 R
[58] Field of Search ................... 333/17 R, 17 L, 101, 333/103, 104, 245, 258, 262; 335/1, 4, 5, 173, 219; 307/317 R, 317 A, 318; 361/2, 8, 11, 13

[56] References Cited

U.S. PATENT DOCUMENTS

| | | | |
|---|---|---|---|
| 3,339,110 | 8/1967 | Jones, Jr. ......................... | 361/13 |
| 3,783,305 | 1/1974 | Lefferts ............................ | 361/13 |
| 4,249,150 | 2/1981 | Bickley et al. .................. | 333/262 |

Primary Examiner—Marvin L. Nussbaum
Attorney, Agent, or Firm—Eugene A. Parsons

[57] ABSTRACT

Pin diodes connected in parallel with a high power RF carrying reed relay are forward biased for conduction when the reed relay is actuated and reverse biased once the reed relay closes so that they are removed from the circuit. Trigger apparatus, including a one-shot circuit, is utilized to activate the diodes for only the required length of time and to provide the correct operation at all frequencies with high power.

8 Claims, 1 Drawing Figure

U.S. Patent     Apr. 9, 1985     4,510,472
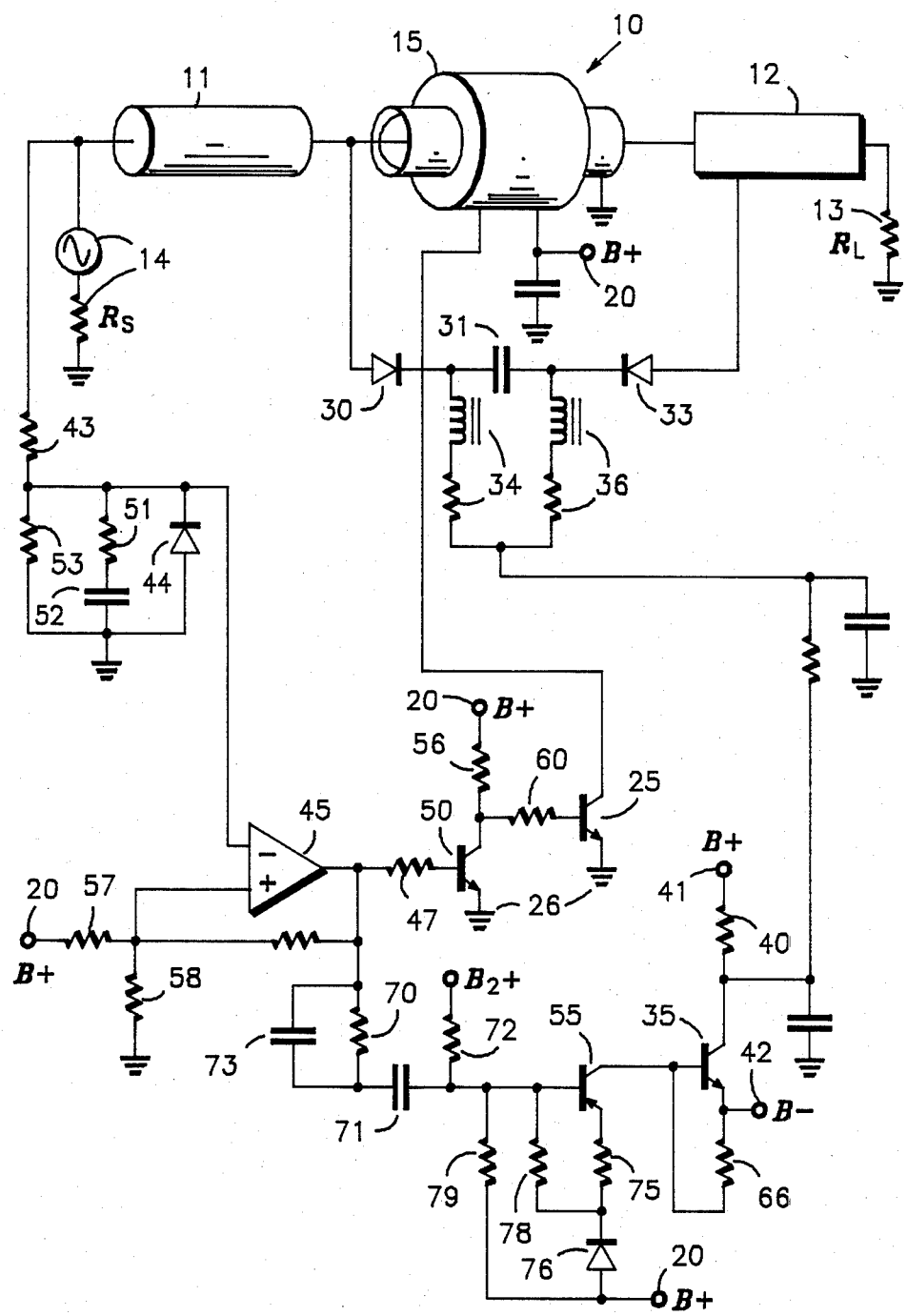

HIGH POWER RF RELAY SWITCH TRIGGER

BACKGROUND OF THE INVENTION

In many applications, such as transmitters, couplers, antennas, test equipment, etc., it is desirable to provide high power RF switches useable from DC to high RF frequencies. In general, evacuated electromechanical RF relays may be constructed which will provide this function but they are relatively slow and very costly. RF pin diode switches are useful in switching high RF frequencies but they are not useful from DC to low RF frequencies and are generally not capable of switching high power.

A high power RF relay switch which combines the best functions of RF relays and RF pin diode switches is disclosed in U.S. Pat. No. 4,249,150, entitled "High Power RF Relay Switch", issued Feb. 3, 1981. This high power RF relay switch includes a reed relay having pin diodes connected in parallel therewith and forward biased for conduction when the reed relay is actuated. The pin diodes are reverse biased once the reed relay closes so that they are removed from the circuits. The biasing is performed by a semiconductor switching circuit which includes a capacitor for timing. However, it has been found that this circuit has some serious drawbacks in that it latches up at certain RF frequencies and does not reverse bias the pin diodes. Since the pin diodes are continuously conducting the high power RF they burn out very rapidly.

SUMMARY OF THE INVENTION

The present invention pertains to a high power RF switch of the type including a relay connected to carry the input high power RF and having at least two pin diodes connected in opposed polarity relationship in parallel with the relay, said switch including trigger apparatus for operating the two pin diodes which apparatus includes detector means for receiving the high power RF and supplying a detected control signal which is compared to a reference level and, if the reference level is exceeded a signal activates a one-shot circuit designed to forward bias the pin diodes for a predetermined length of time after the application of the high power RF input signal. The one-shot circuit is designed so that it will not latch up at any of the operating frequencies and further includes frequency enhancement to ensure the proper operation for the correct length of time throughout the entire operating frequency of the apparatus.

It is an object of the present invention to provide a new and improved trigger apparatus in a high power RF relay switch.

It is a further object of the present invention to provide trigger apparatus which will not lock up under any of the operating frequencies of the RF switch.

These and other objects of this invention will become apparent to those skilled in the art upon consideration of the accompanying specification, claims and drawing.

BRIEF DESCRIPTION OF THE DRAWING

The single FIGURE is a schematic diagram of a high power RF switch including trigger apparatus embodying the present invention.

DESCRIPTION OF THE PREFERRED EMBODIMENT

Referring specifically to the FIGURE, the numeral 10 generally designates a relay assembly, which in this embodiment is a reed relay operating as a switch between a section of coaxial cable 11 and a section of microstrip circuitry 12. While this specific reed relay assembly is illustrated because of its convenience and simplicity, it will be understood by those skilled in the art that many other assemblies and types of relays might be utilized. Further the reed relay assembly 10 includes a generally tubularly shaped coil 15 surrounding the reed switch for actuation thereof. It will also be understood that many other types of actuation means might be utilized if desired. The coil 15 has a pair of terminals for applying power thereto, one of which is connected to a B+ terminal 20 and the other of which is connected to the collector of an NPN transistor 25. The emitter of the transistor 25 is connected directly to a common terminal 26, which in this embodiment is illustrated as ground. Therefore when the transistor 25 is turned on by a signal on the base thereof one terminal of the coil 15 is grounded and power is applied by way of the terminal 20 to actuate the reed relay of the assembly 10. The anode of a first diode 30 is connected to the junction of the coaxial cable 11 and the reed relay assembly 10 and the cathode is connected to one side of a capacitor 31. The anode of a second diode 33 is connected to the microstrip circuit 12 and the cathode is connected to the opposite side of the capacitor 31. Thus the diodes 30 and 33 are connected in parallel with the contacts of the reed relay assembly 10 and in opposed polarity relationship. Further, in this embodiment the diodes 30 and 33 are pin diodes constructed to switch high RF frequency signals.

The junction of diode 30 and capacitor 31 is connected through a series connected RF choke and resistor 34 to the collector of an NPN type transistor 35. The junction of the diode 33 and the capacitor 31 is connected through a series connected RF choke and resistor 36 to the collector of the transistor 35. The collector of the transistor 35 is also connected through a resistor 40 to a B++ terminal 41 adapted to have applied thereto a positive voltage somewhat higher than the positive voltage applied to the terminal 20. The emitter of the transistor 35 is connected to a B− terminal 42 which is adapted to have a negative voltage applied thereto. Thus when the transistor 35 is turned on by a positive voltage on the base the diodes 30 and 33 have negative voltage applied to the cathodes thereof and they are forward biased. When the transistor 35 is turned off a positive voltage is applied to the cathodes of the diodes 30 and 33 and they are reversed biased.

The high power RF is coupled to the switch at the input of the coaxial cable 11, as represented by the signal generator and source resistance ($R_s$) 14. The high power RF input is also coupled through a current limiting resistor 43 to an inverting input of a comparator type of operational amplifier 45. The high power RF input is detected by means of a diode 44 connected between the noninverting input and ground. DC and AC surge and transient suppression is obtained by means of a series connected resistor 51 and capacitor 52 connected in parallel with the diode 44 and a resistor 53 connected in parallel with the diode 44. The resistor 53 provides a low impedance to ground for DC surges and the series connected resistor 51 and capacitor 52 provide a low impedance to AC transients. A pair of resistors 57 and 58, connected in series between the B+ terminal 20 and ground form a resistive divider network. The junction of the resistors 57 and 58 is connected to the noninverting input of the comparator, 45 to provide a reference level for the input signals. When the detected signal supplied to the inverting input of the comparator 45 exceeds the reference level supplied to the noninverting input the output of the comparator 45 drops to a near ground potential.

The output of the comparator 45 is connected through a resistor 70 and capacitor 71 to the base of a PNP type transistor 55. The base of the transistor 55 is also connected through a resistor 72 to a terminal adapted to have a source of positive power, designed B2+ supplied thereto. A capacitor 73 is connected in parallel with the resistor 70 for frequency enhancement. After the output of the comparator 45 drops because of a proper input signal, capacitor 71 begins to charge toward the B2+ supply at a time generally determined by the RC time constant of the resistor 70 and capacitor 71. The capacitor 73 is employed to speed up the turn off signal to transistor 55.

The collector of the transistor 55 is connected directly to the base of the transistor 35, which base is also connected to the emitter of the transistor 35 by a resistor 66. The emitter of the transistor 55 is connected through a small current limiting resistor 75 to the cathode of a diode 76. The anode of the diode 76 is connected to the B+ terminal 20. The base of the transistor 55 is also connected through a clamping resistor 78 to the cathode of the diode 76 and through a second resistor 79 to the anode of the diode 76. The resistor 78 makes the circuit into a pulse circuit by clamping the base of the transistor 55 to the emitter during normal, or quiescent, operation. The resistor 79 reverse biases the diode 76 during normal or quiescent operation to ensure the complete and positive nonconduction of transistor 55.

In the operation of the trigger apparatus, when the output of the comparator 45 drops because of a proper input signal the capacitor 71 initially communicates this low potential to the base of the transistor 55. The base-to-emitter junction of the transistor 55 forms one diode drop and the diode 76 forms a second diode drop so that the low potential transmitted by the capacitor 71 must be at least two diode drops below the B+ potential on terminal 20. Since this two diode drop potential is initially exceeded, the transistor 55 conducts, which supplies a positive potential to the base of the transistor 35. The transistor 35 conducts to apply a negative voltage to the cathodes of the diodes 30 and 33 and forward bias them into an on or conducting condition. As the capacitor 71 begins to charge towards the B2+ potential, the potential at the base of the transistor 55 rises at a rate determined by the RC constant of the resistor 70 and capacitor 71. When the potential at the base of the transistor 55 rises above the two diode drop potential required, the transistor 55 is quickly turned off and clamped in that condition by the resistors 78 and 79 and the diode 76. Thus, the circuitry between the output of the comparator 45 and the base of the transistor 35 is referred to as a one-shot circuit because it turns on only for a predetermined time each time the comparator 45 provides the proper output signal.

When the proper signal is applied to the inverting input terminal of the comparator 45 the output of the comparator 45 drops sharply, as previously described, thereby turning off the transistor 50. When the transistor 50 turns off a positive potential is applied to the base of the transistor 25, turning this transistor on. As mentioned previously, when the transistor 25 turns on the coil 15 is grounded thereby applying a potential thereacross to actuate the reed switch. Also, for a predetermined period of time the one-shot circuit turns on the transistor 35 to remove the positive voltage on the terminal 41 from the cathodes of the diodes 30 and 33 and apply the negative voltage at the terminal 42 thereto. Thus, the diodes 30 and 33 are forward biased so the DC current flows through the resistor 14, 13, 34 and 36 and diodes 30 and 33. This provides a low resistance path for RF signals through the diodes 30 and 33 and the capacitor 31 in parallel with the reed switch of the assembly 10.

It has been determined that the contacts of the reed switch require approximately 3msec. to close after high power RF is applied to the input of the coaxial cable 11. The one-shot circuit is designed so that the diodes 30 and 33 are forward biased for some predetermined time generally between 7 and 10 msec. If the diodes 30 and 33 do not conduct for a long enough period of time the relay contacts, which may still be mechanically bouncing, may have a tendency to burn or weld together and if the diodes 30 and 33 conduct for too long a time the high power RF will greatly reduce their life expectancy. After the one-shot circuit stops conducting and a reverse bias potential is reapplied to the diodes 30 and 33, the transistors 50 and 25 continue to hold the relay contacts in a closed position for the conduction of the high power RF therethrough.

The DC and AC surge and transient suppressors in parallel with the diode detector improve the overall response of the high power RF switch and improve the noise immunity. The substitution of a coaxial cable 11 for the previously utilized microstrip input circuitry greatly improves the RF susceptibility, allows the use of the circuitry in higher ambient temperatures and operates as a heat sink for the input of the RF switch. Whereas it was previously determined that a simple timing capacitor can cause lock up of the circuitry and burn-out of the pin diodes, the one shot circuit disclosed herein positively operates for only the required predetermined time and allows a greater range of operating frequencies with high power.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. In a high power RF switch of the type including a relay connected to carry the input high power RF and having at least two pin diodes connected in opposed polarity relationship in parallel with the relay, trigger apparatus for operating the two pin diodes comprising:
   detector means coupled to receive the input high power RF and supply a detected output signal in response thereto:
   comparator means, having an input coupled to the output of said detector means, a reference level input and an output, for supplying an output signal at the output thereof whenever the detected output signal exceeds the reference level; and a one shot circuit coupled to the output of said comparator means and having an output coupled to the two pin diodes for causing the pin diodes to conduct high power RF only for a predetermined length of time after the output signal is supplied by said comparator means.

2. Trigger apparatus as claimed in claim 1 wherein the detector means includes a DC and an AC surge and transient suppressor in parallel with a diode detector.

3. Trigger apparatus as claimed in claim 1 wherein the one shot circuit includes a resistor and capacitor connected in series to form an RC timing circuit.

4. Trigger apparatus as claimed in claim 3 wherein the timing circuit further includes a capacitor connected in parallel with the resistor to provide frequency enhancement.

5. Trigger apparatus as claimed in claim 4 wherein the one shot circuit further includes a transistor having a base, emitter and collector with the timing circuit connected in series between the base of said transistor and the output of said comparator means.

6. Trigger apparatus as claimed in claim 5 wherein the one shot circuit further includes a clamping resistor coupled between the base and emitter of said transistor.

7. Trigger apparatus as claimed in claim 6 wherein the one shot circuit further includes at least one diode coupling the emitter of said transistor to a source of power and a resistor connected to the base of said transistor and to said diode for biasing said diode into a nonconducting state whenever there is no signal at the output of said comparator means.

8. Trigger apparatus as claimed in claim 1 wherein the high power RF is coupled to the relay by a portion of coaxial cable.

* * * * *